United States Patent [19]

Sameshima

[11] Patent Number: 5,332,962
[45] Date of Patent: Jul. 26, 1994

[54] PEAK VOLTAGE DETECTOR WITH FERROELECTRIC ELEMENT

[75] Inventor: Katsumi Sameshima, Kyoto, Japan

[73] Assignee: Rohm Co., Ltd., Kyoto, Japan

[21] Appl. No.: 956,102

[22] Filed: Oct. 2, 1992

[30] Foreign Application Priority Data

Oct. 8, 1991 [JP] Japan .................................. 3-260375

[51] Int. Cl.$^5$ .............................................. G01R 1/04
[52] U.S. Cl. .................................. 324/103 P; 324/72; 324/457; 365/191; 365/145
[58] Field of Search .................. 395/24; 365/145, 149; 324/158 F, 158 R, 158 P, 72, 457

[56] References Cited

U.S. PATENT DOCUMENTS

| | | | |
|---|---|---|---|
| 4,106,107 | 8/1978 | Goodman | 365/191 |
| 5,055,897 | 10/1991 | Canepa et al. | 395/24 |
| 5,151,877 | 9/1992 | Brennen | 365/145 |

Primary Examiner—Kenneth A. Wieder
Assistant Examiner—Barry C. Bowser
Attorney, Agent, or Firm—Oliff & Berridge

[57] ABSTRACT

A peak voltage detector to measure the peak output voltage of light sensors, heat sensors and the like without the need for a reference voltage. In a ferroelectric element, the ferroelectric body is positioned between PT electrodes. The ferroelectric body has a thickness that progressively varies from one end to the other. A D.C. voltage dependent upon the direct current power supply is applied to generate a maximum spontaneous polarization Pr. The output voltage from light sensors, heat sensors and the like is of a reverse polarity with respect to that of the power supply. The output voltage is applied to the ferroelectric element. Depending on this external voltage, reverse polarization will be generated in either one part, certain parts, or all of the ferroelectric element. By measuring this reverse polarization with the polarization measuring circuit, the peak value of the external voltage is measured.

6 Claims, 8 Drawing Sheets

PEAK VOLTAGE DETECTOR WITH FERROELECTRIC ELEMENT

BACKGROUND OF THE INVENTION

1. Field of the Invention

This invention is related to a peak voltage detector with a ferroelectric element, and in particular to a device which can detect the peak voltages output by sensing devices such as light sensors, heat sensors, pressure sensors and the like without the need for a reference voltage.

2. Description of the Related Art

Figure 1:
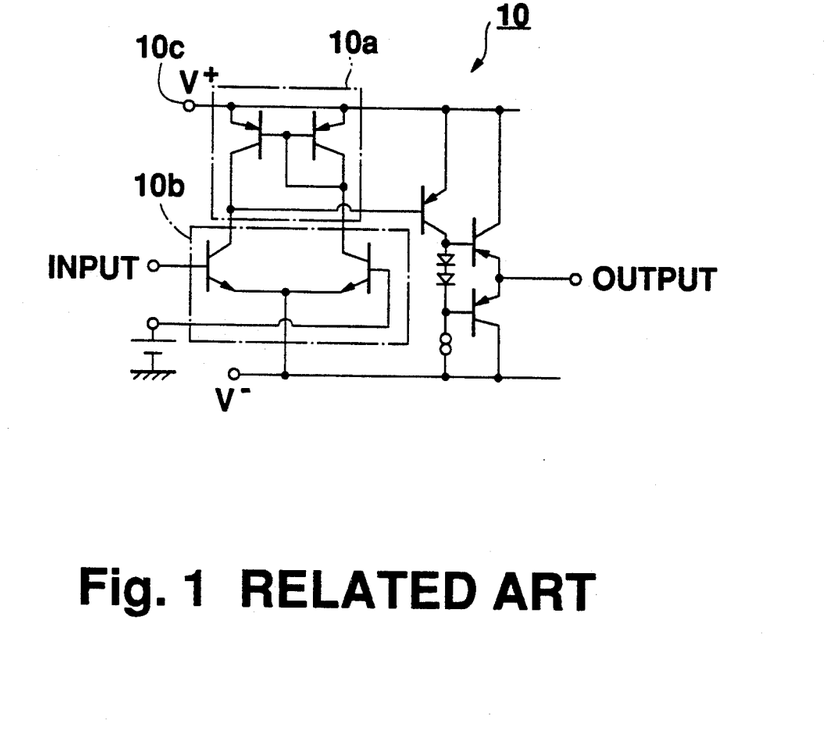
FIG. 1 is a circuit diagram of the comparator in the prior art.

Generally, sensing devices such as light, heat, pressure and wind sensors sense the varying physical amounts by generating a voltage corresponding to the amount of light, heat or pressure to be detected. Conventionally, a comparator (10) such as that shown in FIG. 1 for example, could be used to detect the fact that these voltages have exceeded the reference voltage value. The comparator (10) consists of the well-known current mirror circuit (10a) and a differential circuit (10b) arranged in such a way that the output of comparator (10) represents the difference in voltage between the input terminal and the inverting input terminal. Therefore, by applying the designated reference voltage to the inverting input terminal and inputting the output voltage from light sensors, heat sensors and the like to the input terminal it is possible to monitor whether or not the externally applied sensing voltage exceeds the predetermined reference voltage.

However, in using voltage measuring devices such as this kind of comparator in the prior art, there is a problem where if the external power supply (10c) is defective the comparator gives an invalid output. Therefore, in order to monitor peak voltages, it is usually necessary to connect an external memory to the output of the comparator to maintain continuity in the output, resulting in further complication of the construction of the device.

SUMMARY OF THE INVENTION

An object of the present invention is to provide a peak voltage detector with a ferroelectric element which will store peak voltages in a nonvolatile manner without requiring a predetermined reference voltage.

In accordance with the present invention the peak voltage detector is characterized by a ferroelectric element having thickness which is progressively greater from one end thereof to the other, a reset circuit which produces maximum spontaneous polarization upon giving a predetermined reset voltage to the ferroelectric element, a ferroelectric element employing this maximum spontaneous polarization to measure an externally applied voltage of reverse polarity with respect to the reset voltage, and a polarization detection circuit for measuring the reverse polarization generated in the ferroelectric element.

The peak voltage detection device in this invention is constructed in the above mentioned way so it can measure the peak voltage by means of the spontaneous polarization of the ferroelectric element.

As is commonly known, by applying an electric field to the ferroelectric element, spontaneous polarization in the ferroelectric element reverses the direction of the polarization with regards to the applied electric field, thus showing an extremely similar characteristic to the B-H curve of a ferromagnetic element (The P-E Hysteresis loop of ferroelectric elements). With the peak voltage detector in this invention, the ferroelectric element is spontaneously polarized in one direction, then this spontaneous polarization is partially reversed by the inputting of an external voltage meaning that the remaining polarization can be used to measure the peak voltage.

In the case where the thickness of the ferroelectric element changes, it is known that the value of the coercive electrical field necessary to reverse the spontaneous polarization increases in proportion with the thickness of the ferroelectric element.

Accordingly, in the case of applying a voltage to the ferroelectric element having thickness which is progressively greater from one end thereof to the other, in the thin area, a Supplied electric field greater than the coercive electric field is applied so the direction of polarization is reversed, while in the thick area, the value of the supplied electric field cannot exceed that of the coercive electric field so that the direction of polarization is not reversed. Therefore, with the ferroelectric element having thickness which is progressively greater from one end thereof to the other, by measuring which of these areas have had the direction of polarization reversed, it becomes possible to detect the value of the externally applied sensing voltage.

DETAILED DESCRIPTION OF THE PREFERRED EMBODIMENT

A preferred embodiment of the present invention with a peak voltage detector and a ferroelectric element will now be described with reference to the diagrams.

Figure 2:
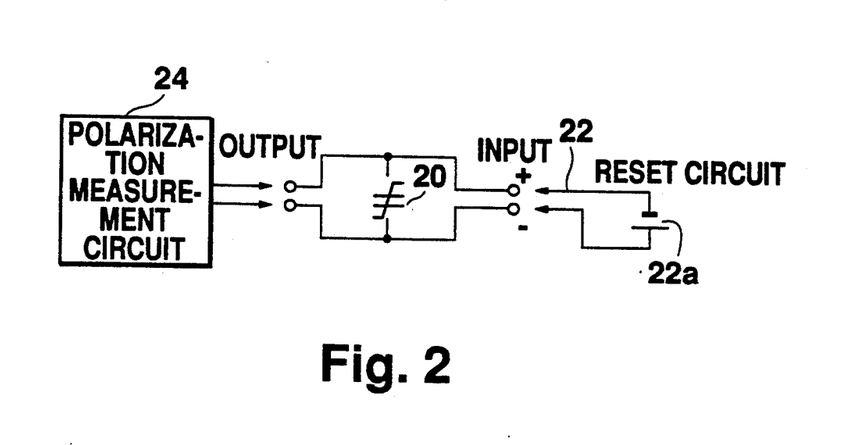
FIG. 2 is a diagram of the complete construction of a preferred embodiment of this invention.
Figure 3:
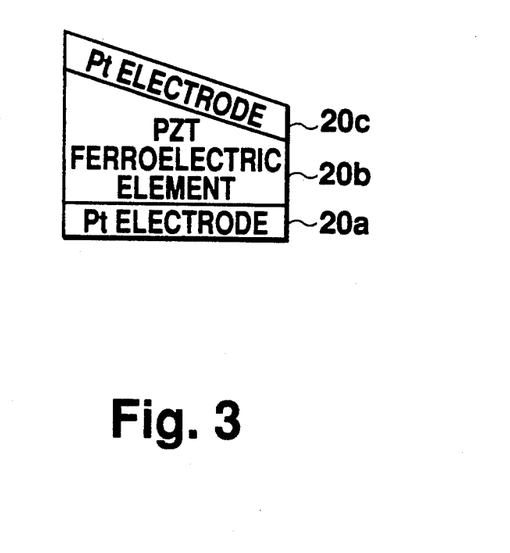
FIG. 3 is a diagram of the construction of the ferroelectric element in the preferred embodiment of the present invention.

FIG. 2 shows the complete construction of this preferred embodiment. FIG. 3 shows a ferroelectric element (20) made of PZT (zirconate, titanate, lead) and having thickness which is progressively greater from one end thereof to the other. The ferroelectric element is of a construction where the ferroelectric body (20b) is sandwiched between the Pt electrodes (20a) and (20c). Firstly, a reset circuit (22) is connected into the circuit for spontaneously polarizing the ferroelectric element (20) having a thickness which is progressively greater from one end thereof to the other. The reset circuit (22)'s internal power supply (22a) is employed to apply a d.c. voltage across the Pt electrodes (20a) and (20c). This creates an electric field in the ferroelectric PZT element (20b) which lies between (20a) and (20c) and thus produces maximum spontaneous polarization Pr in the ferroelectric PZT element (20b). It is necessary to change the voltage from the direct current power supply in response to the thickness of the PZT film for varying thicknesses of PZT films so the voltage from the direct current power supply is set up to be sufficient for the maximum thickness of the PZT film. Specifically, it is necessary to apply a voltage from the D.C. power supply (22a) which is large enough to create an electric field capable of generating a maximum spontaneous polarization throughout the whole of the PZT ferroelectric element (20b).

At this point, after maximum spontaneous polarization has been produced in the ferroelectric element (20), the maximum value of the external voltage to be sensed is measured by connecting it the ferroelectric element in reverse polarity to that of the reset voltage (22a). In the following, an explanation is given regarding this peak voltage output calculation process for the common case where the voltage from a wind pressure sensor is calculated.

Figure 4:
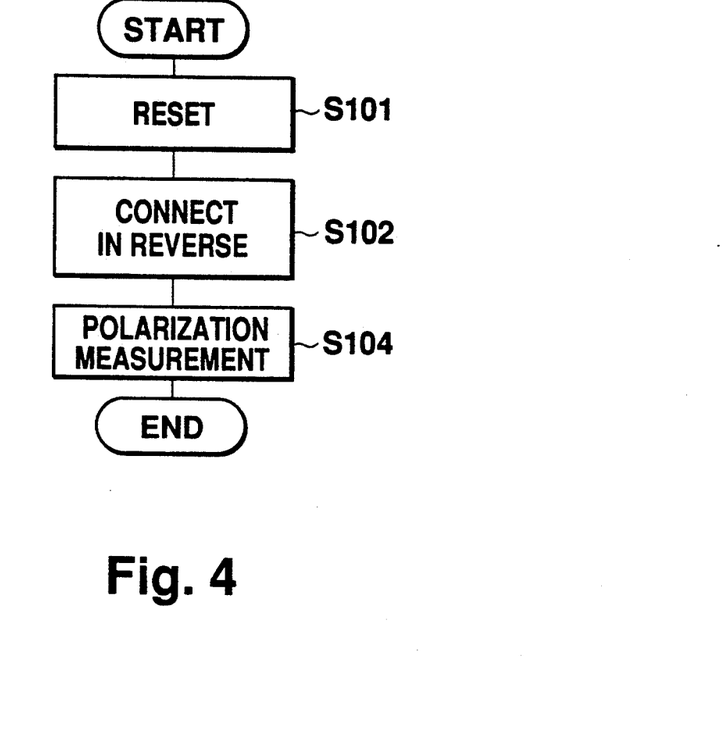
FIG. 4 is a measurement system flowchart for the embodiment of the present invention.
Figure 5:
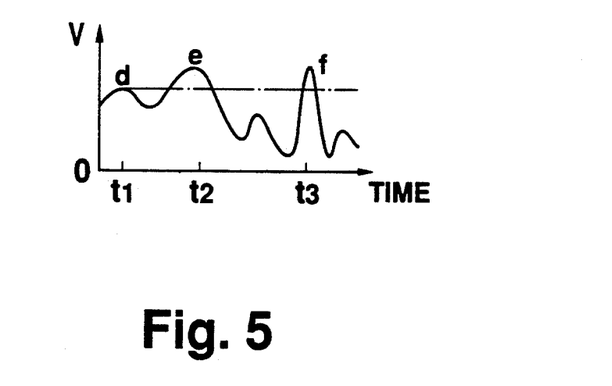
FIG. 5 is the output characteristic of a wind speed sensor in the embodiment of the present invention.

FIG. 4 shows a flowchart for the set-up process in this practical example. Here, S101 is the aforementioned reset circuit (22), which generates maximum spontaneous polarization in the ferroelectric element (20). Next, in S102, the voltage output from the wind pressure sensor which is of opposite polarity to that of the voltage from the reset circuit 22, is connected across the ferroelectric element 20. In FIG. 5 a common characteristic for the output voltage from the wind pressure sensor is shown, where the horizontal axis is time, the vertical axis expresses voltage, and times t1, t2, and t3 are the output times of each respective peak value d, e, and f. An external voltage having this kind of characteristic is then input to the ferroelectric element (20).

Figure 6:
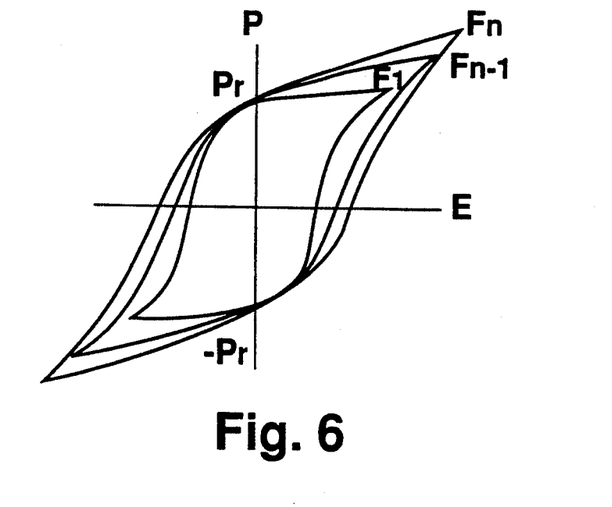
FIG. 6 is a diagram of the P-E hysteresis loop of the ferroelectric element in the embodiment of the present invention.
Figure 7:
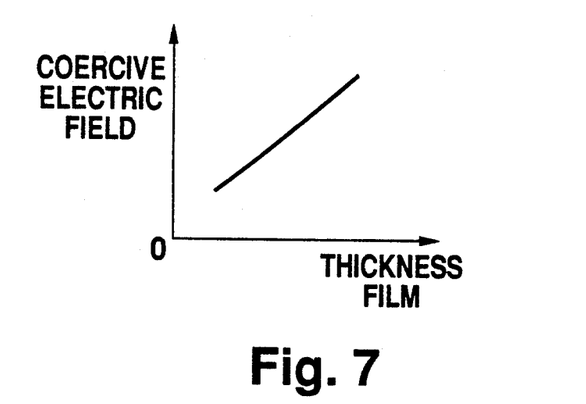
FIG. 7 is a graph showing the relationship between the film thickness and the coercive electric field of the ferroelectric element in the embodiment of the present invention.

So, as the aforementioned ferroelectric element (20) in this practical example has a thickness which is progressively greater from one end thereof to the other, we have a characteristic where the value of the coercive electric field also changes progressively with thickness. FIG. 6 shows the P-E hysteresis loops of ferroelectric elements made using various film thicknesses. In the diagram, F1, F2, ... Fn−1, Fn shows the thickness of the ferroelectric element's film increasing sequentially. As is clarified by the diagram, the size of the maximum spontaneous polarization Pr does not change substantially if the film thickness is changed but it is clear that the value of the coercive electric field which opposes the electric field created by the reverse polarization increases as the ferroelectric element's film thickness increases. FIG. 7 shows the relationship between the film thickness of the ferroelectric element and the coercive electric field, and it can be understood that the coercive electric field increases in direct proportion to the film thickness.

As is shown in this practical example, in the case where an external sensing voltage is input to the ferroelectric element (20) having thickness which is progressively greater from one end thereof to the other, in the thin area of the thick film the value of the corresponding coercive electric field is low so reverse polarization can be attained upon the application of a low external sensing voltage. On the other hand, in the thick area of the thick film the coercive electric field is strong, so the value of the external sensing voltage necessary to create reverse polarization becomes high. Therefore, depending on the value of the external sensing voltage applied:

(1) Reverse polarization does not occur at all.
(2) Reverse polarization is generated in the thin area of the thick-film of the ferroelectric element but not in the thick area.
(3) Reverse polarization is generated in all areas.
Thus giving three modes.

Figure 8:
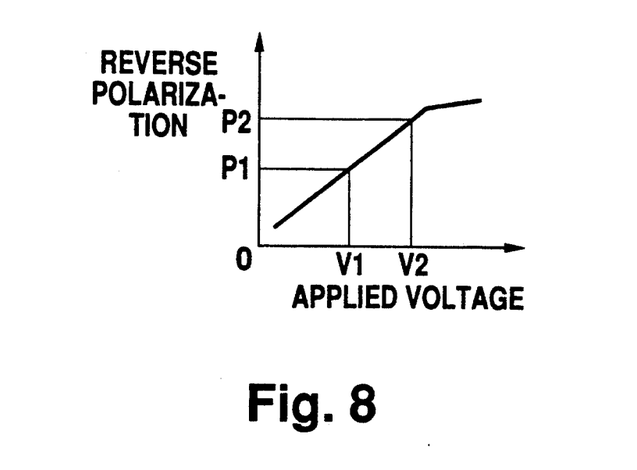
FIG. 8 is a graph showing the relationship between the applied sensing voltage and the reverse polarization in the embodiment of the present invention.
Figure 9A:
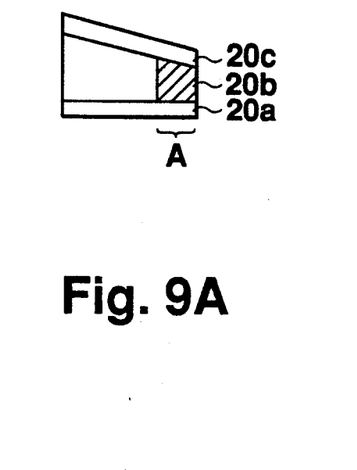
FIGS. 9A and 9B describe the regions of reverse polarization in the ferroelectric element in the embodiment of the present invention.
Figure 9B:
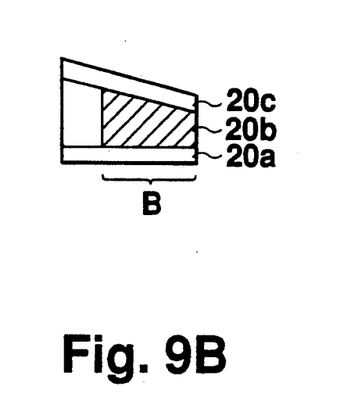

In FIG. 8 and FIGS. 9a and 9b various degrees of reverse polarization generated in the ferroelectric element (20) are shown, these being dependant on the external sensing voltage applied. In the case where the externally applied sensing voltage is V1, in the area A where the coercive electric field opposing this applied voltage is of a low voltage, the spontaneous polarization is reversed and this reversed area P1 is shown. Also, in the case where the externally applied sensing voltage is V2, (as shown in FIG. 9b), the larger area B is reversed, and the reverse polarization P2 is shown.

Before trying to change the amount of reverse polarization generated in the ferroelectric element (20) using a corresponding value for the input voltage, we should investigate the relationship between the reverse polarization and the input voltage. By doing this, as the polarization generated depends upon the size of the external sensing voltage the polarization measurement circuit (24) can be used to measure the maximum value of the external sensing voltage input.

Figure 10:
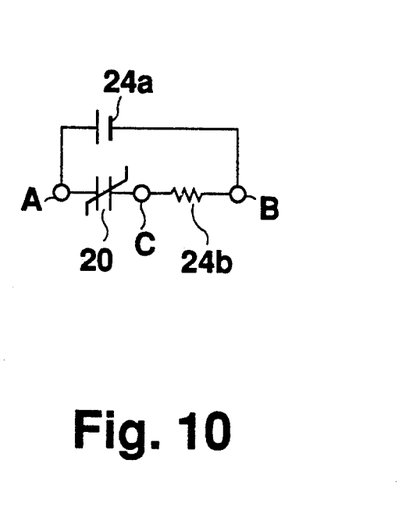
FIG. 10 is a circuit diagram of the polarization detection circuit in the embodiment of the present invention.
Figure 11:
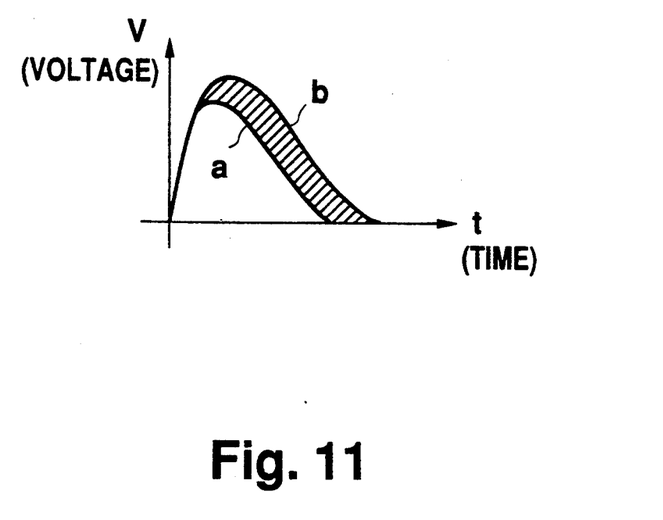
FIG. 11 is a graph describing the theory of the polarization detection employed in the embodiment of the present invention.

FIG. 10 is a circuit diagram of the polarization detection circuit used in this practical example and FIG. 11 describes the polarization measurement theory. The polarization detection circuit has a direct current power supply (24a) which generates maximum spontaneous polarization in the ferroelectric element (20), (a voltage similar to that of the direct current power supply 22a in the reset circuit 22 is required), and a resistor (24b), meaning that there is no potential difference between B and C and the remaining polarization can be detected by monitoring the direct current.

Accordingly, a voltage is applied across A and B causing maximum spontaneous polarization in the ferroelectric element (20). At this time the variation in potential across B and C is measured. For the case where the ferroelectric element (20) still has maximum spontaneous polarization due to the operation of the reset circuit, there is a change as shown by (a) in FIG. 11. However, where the direction of polarization of the ferroelectric element was reversed to some extent by an external sensing voltage, as in the case of FIGS. 9a and 9b, the change shown by (b) in FIG. 11 is observed. In the case where this ferroelectric element (20) still has maximum spontaneous polarization the P-E hysteresis loop changes as described in the above. When the ferroelectric element (20) does not still have maximum spontaneous polarization as would be the case if an external sensing voltage had been detected, the maximum spontaneous polarization only has to be generated in the areas which were reversed by the external sensing voltage so the P-E hysteresis loop changes accordingly.

So, in the case where the maximum spontaneous polarization exclusive of the remaining polarization is generated, a change in voltage such as that in (b) is seen, and a voltage twice that of the predetermined reference voltage is present between A and B. Therefore by investigating the variation (the shaded area in FIG. 11) of this voltage which is twice that of the predetermined reference voltage, the value of the remaining polarization can be determined. So, when there is still maximum spontaneous polarization there is no difference, and when there isn't still maximum spontaneous polarization, the difference corresponding to the remaining polarization can be observed.

Figure 12A:
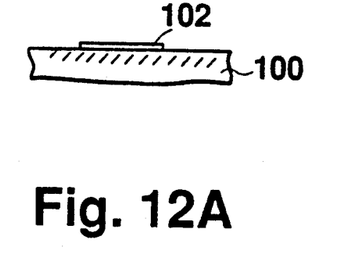
FIGS. 12A–12E show a description of the method of manufacturing the ferroelectric element in this embodiment of the invention.
Figure 12B:
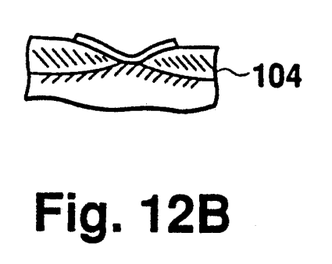

FIGS. 12A-12E show methods for manufacturing the ferroelectric element having thickness which is progressively greater from one end thereof to the other employed in the preferred embodiment. First, in FIG. 12A a silicon-nitrogen film 102 is accumatively layered using the CVD method onto a silicon substrate 100. Then, as shown in FIG. 12B, the silicon substrate 100 is subjected to heat and oxygen, and silicon oxide layers 104 are formed on both sides of the silicon-nitrogen layer.

Figure 12C:
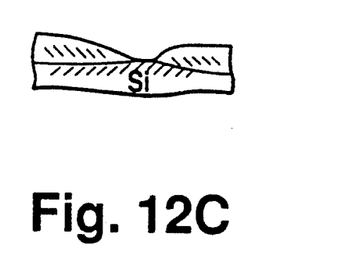
Figure 12D:
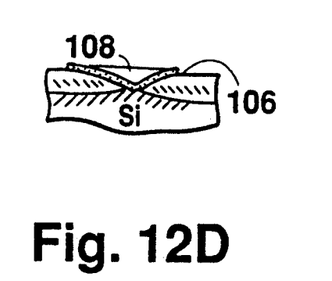
Figure 12E:
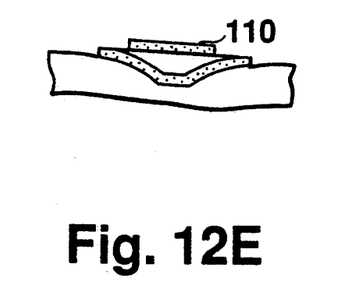

After this, as shown in FIG. 12C, the silicon-nitrogen film 102 is etched away, exposing the surface of the silicon oxide layer, as is shown in FIG. 12d, and a Pt layer 106 which will become an electrode is spot-formed on the inclined regions of the silicon oxide layer 104. Then, the ferroelectric body of PZT is put on top of this Pt film 106 and then baked at a fixed temperature. After this, the surface is leveled by etching, and again as shown in FIG. 12E a Pt film 110 is spot formed on top of the whole body of the ferroelectric body of PZT. Thus, a ferroelectric element consisting of a ferroelectric body of PZT having thickness which is progressively greater from one end thereof to the other sandwiched between Pt electrodes is formed.

Figure 13A:
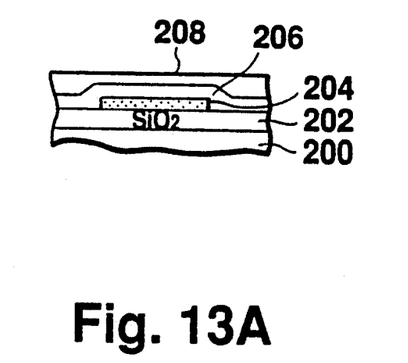
FIGS. 13A–13D show an explanation of a further way of manufacturing the ferroelectric element in this embodiment of the invention.

FIGS. 13A-13D show a further way of manufacturing the ferroelectric element in the preferred embodiment. Regarding this method of manufacture, a ferroelectric body having thickness which is progressively greater from one end thereof to the other is made by employing a special form of Cr mask in the hot-mask process. First of all, as shown in FIG. 13A, a silicon dioxide layer 202 is formed by exposing the silicon substrate to heat and oxygen. Then, a Pt layer which is to become the lower electrode is spot formed on the silicon oxide layer, and again a ferroelectric body of PZT is put on top of this. After this, it is baked at a fixed temperature, and a positive type resist 208 is put on.

Figure 13B:
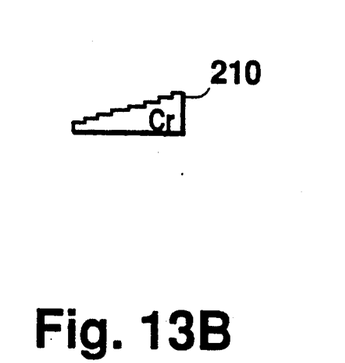
Figure 13C:
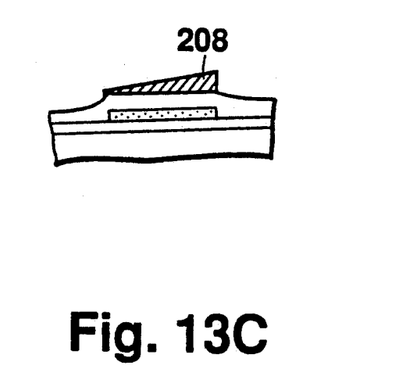

Next, as shown in FIG. 13B, in order to give one face a stepped structure, a Cr mask having thickness which is progressively greater from one end thereof to the other is employed, and the positive type resist 208 is exposed to light. At this time, as the thickness of the Cr mask changes in a stepped manner and the amount of light which penetrates this mask also changes in a stepped manner, so the amount of light the positive resist 208 is exposed to also changes in this stepped manner. So, following this exposure to light, as shown in FIG. 13C some areas of the Cr mask 210 are quite thin so, with sufficient exposure to light in these areas a large amount of photo-resist is removed. On the other side, in the areas where the Cr mask 210 is quite thick, even after removal by exposure to light there will be sufficient positive type resist remaining. The result of this, shown in FIG. 13C is that we have acquired a positive type resist 208 having thickness which is progressively greater form one end thereof to the other.

Figure 13D:
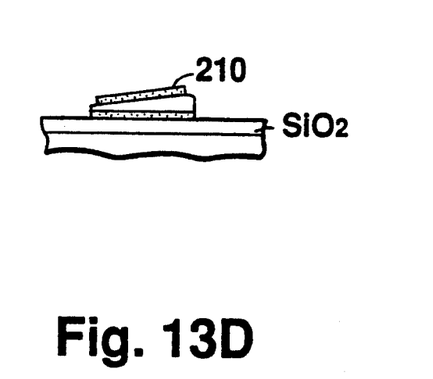

Finally, as shown in FIG. 13D, this positive type resist 208 is then etched until the surface of the resistant silicon oxide layer 202 becomes exposed, and a Pt layer 210 which becomes the upper electrode is spot-formed. So in this way, a ferroelectric element having thickness which is progressively greater from one end thereof to the other is made for the preferred embodiment.

What is claimed is:

1. A peak voltage detector having a ferroelectric body, the detector comprising:
   (a) a ferroelectric element having a thickness, the thickness becoming progressively greater from a first end of the element to a second end of the element;
   (b) a reset circuit generating a maximum spontaneous polarization in said ferroelectric element by applying an electric field across said ferroelectric element; and
   (c) a polarization detection circuit detecting a reverse polarization generated in said ferroelectric element, the reverse polarization being caused by an externally-input sensing voltage.

2. The peak voltage detector of claim 1, wherein the ferroelectric element comprises a ferroelectric body positioned between two metal electrodes.

3. The peak voltage detector of claim 1, wherein said reset circuit includes a direct current power supply applying the electric field to said ferroelectric element, the applied electric field being greater than a maximum coercive electric field of said ferroelectric element.

4. The peak voltage detector of claim 1, wherein said polarization detection circuit includes a direct current power supply and a resistor connected in series, the power supply and resistor applying an electric field to said ferroelectric element, the applied electric field being greater than a maximum coercive field of said ferroelectric element.

5. The peak voltage detector of claim 2, wherein said ferroelectric body is formed from PZT.

6. A peak voltage detector having a ferroelectric body, the detector comprising:
   (a) a ferroelectric element having a ferroelectric body positioned between two metal electrodes, the ferroelectric body having a thickness, the thickness of the body becoming progressively greater from a first end of the body to a second end of the body;
   (b) a reset circuit including a direct current power supply, said reset circuit generating a maximum spontaneous polarization by applying an electric field to said ferroelectric element, the applied electric field being greater than a maximum coercive electric field in said ferroelectric element;
   (c) a polarization detection circuit including a second direct power supply and a resistor connected in series with said second direct power supply, the polarization detection circuit detecting a reverse polarization caused by applying an external voltage to said ferroelectric element by applying a direct electric field at least twice to said ferroelectric element, the value of the direct electric field being greater than the maximum coercive electric field of said ferroelectric element.

* * * * *